(12) United States Patent
Hsu

(10) Patent No.: US 12,610,805 B2
(45) Date of Patent: Apr. 21, 2026

(54) SEMICONDUCTOR DEVICE WITH POLYMER LINER AND METHOD FOR FABRICATING THE SAME

(71) Applicant: NANYA TECHNOLOGY CORPORATION, New Taipei City (TW)

(72) Inventor: Ping Hsu, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 395 days.

(21) Appl. No.: 18/520,955

(22) Filed: Nov. 28, 2023

(65) Prior Publication Data

US 2025/0140651 A1 May 1, 2025

Related U.S. Application Data

(62) Division of application No. 18/385,504, filed on Oct. 31, 2023.

(51) Int. Cl.
*H10W 20/20* (2026.01)
*H10W 20/00* (2026.01)
(Continued)

(52) U.S. Cl.
CPC ......... *H10W 20/20* (2026.01); *H10W 20/023* (2026.01); *H10W 20/035* (2026.01);
(Continued)

(58) Field of Classification Search
CPC . H10W 20/20; H10W 20/023; H10W 20/035; H10W 20/075; H10W 90/00;
(Continued)

(56) References Cited

U.S. PATENT DOCUMENTS 9,691,658 B1 * 6/2017 Alptekin ............. H10W 20/054
2006/0202346 A1 * 9/2006 Shih ..................... H10W 20/425
257/774
(Continued)

FOREIGN PATENT DOCUMENTS

TW 201438147 A 10/2014
TW 202309980 A 3/2023

OTHER PUBLICATIONS

Office Action and search report mailed on Sep. 12, 2024 related to Taiwanese Application No. 113100266.

*Primary Examiner* — Mohammad M Hoque
(74) *Attorney, Agent, or Firm* — Xuan Zhang

(57) ABSTRACT

The present application discloses a semiconductor device and a method for fabricating the same. The semiconductor device includes a first substrate including a front side and a back side; a first passivation layer over the front side; a second passivation layer over the back side and having a top surface; a conductive feature in the first passivation layer; a through substrate via (TSV) penetrating through the second passivation layer and the first substrate and electrically coupled to the conductive feature; and a polymer liner between the TSV and the first substrate, wherein the polymer liner has a top surface lower than the top surface of the second passivation layer; a barrier layer between the second passivation layer and the TSV, between the polymer liner and the TSV, and between the interconnect structure and the TSV; and an adhesion layer between the barrier layer and the TSV.

8 Claims, 28 Drawing Sheets

(51) Int. Cl.
    *H10W 90/00*        (2026.01)
    *H10W 80/00*        (2026.01)
    *H10W 90/20*        (2026.01)

(52) U.S. Cl.
    CPC ......... *H10W 20/075* (2026.01); *H10W 90/00*
        (2026.01); *H10W 80/312* (2026.01); *H10W*
        *80/327* (2026.01); *H10W 90/297* (2026.01);
                   *H10W 90/792* (2026.01)

(58) Field of Classification Search
    CPC ............. H10W 80/312; H10W 80/327; H10W
        90/297; H10W 90/792; H10W 72/019;
                      H10W 72/90
    USPC ......................................................... 257/621
    See application file for complete search history.

(56) References Cited

U.S. PATENT DOCUMENTS

| | | |
|---|---|---|
| 2011/0304026 A1 | 12/2011 | Tsui et al. |
| 2015/0257282 A1* | 9/2015 | We ......................... H05K 3/426 |
| | | 427/124 |
| 2017/0148869 A1 | 5/2017 | Detalle |
| 2020/0395338 A1 | 12/2020 | Hsu et al. |

* cited by examiner

102T

102

100B

100

100F

100B

101

201

202

210

Z

102 — 102T

100B

100 — 100U

A1

100SW

R1

102SW

100U

BT

101SW

201

202

210

100F

101 — 101B

Z

102

102T

206M { 206T
       206S
       206B

100B

100

100F

101

101B

102SW

R1

100SW

101SW

BT 201
202 } 210

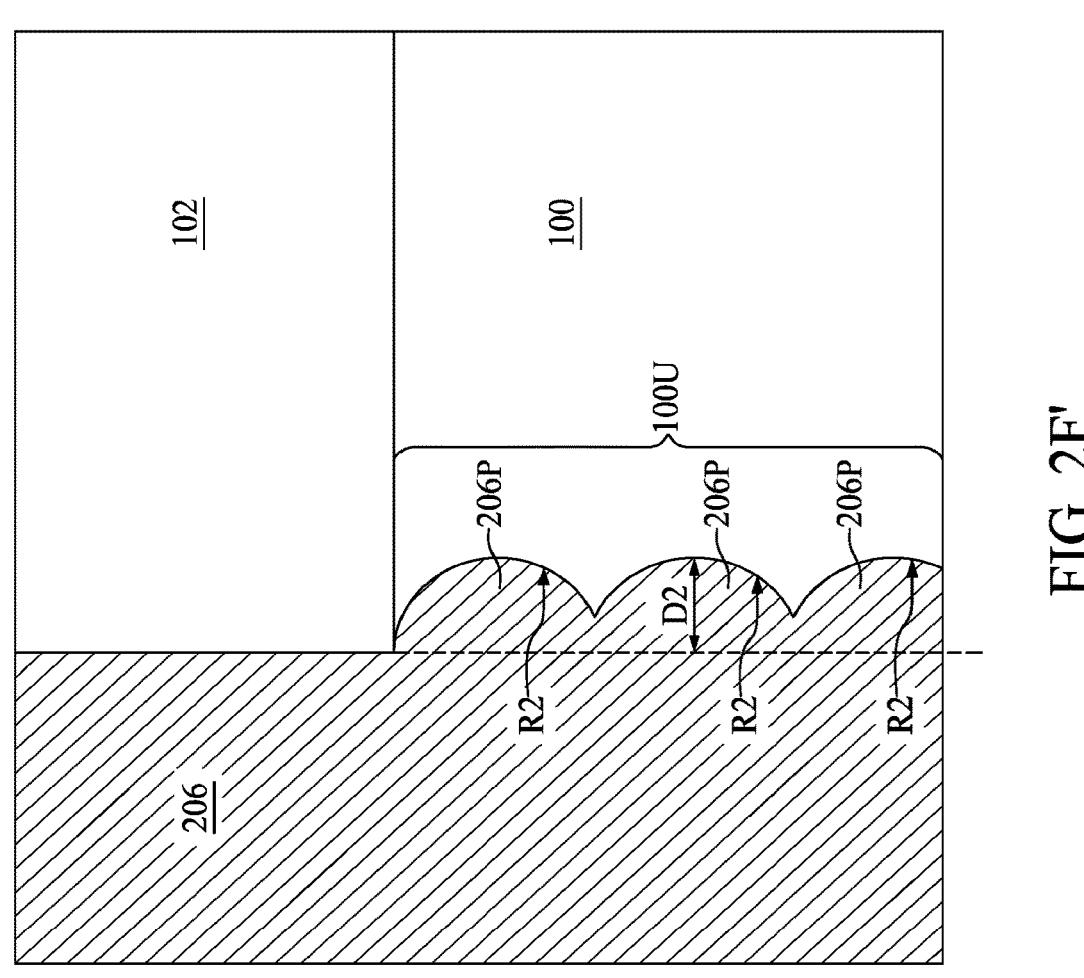
FIG. 2F'

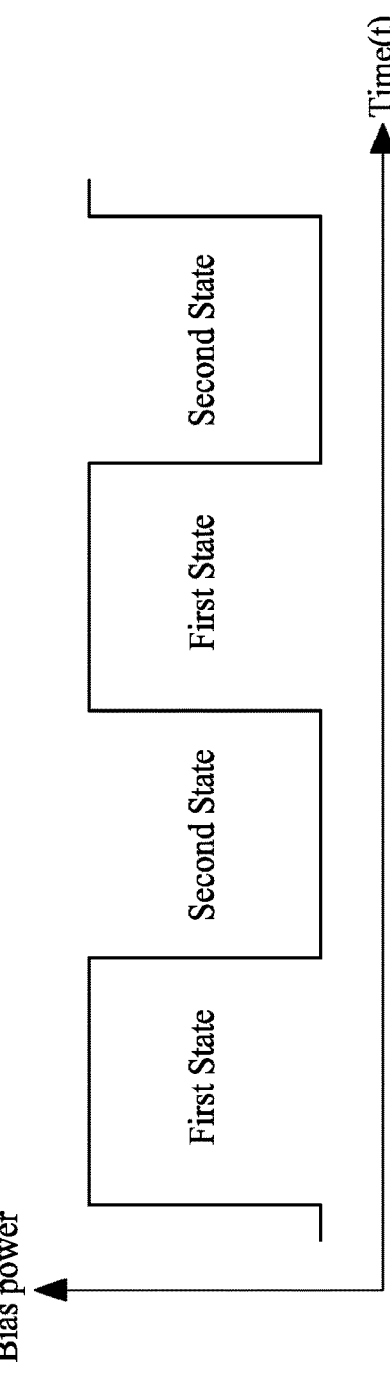
FIG. 2G'

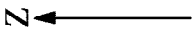
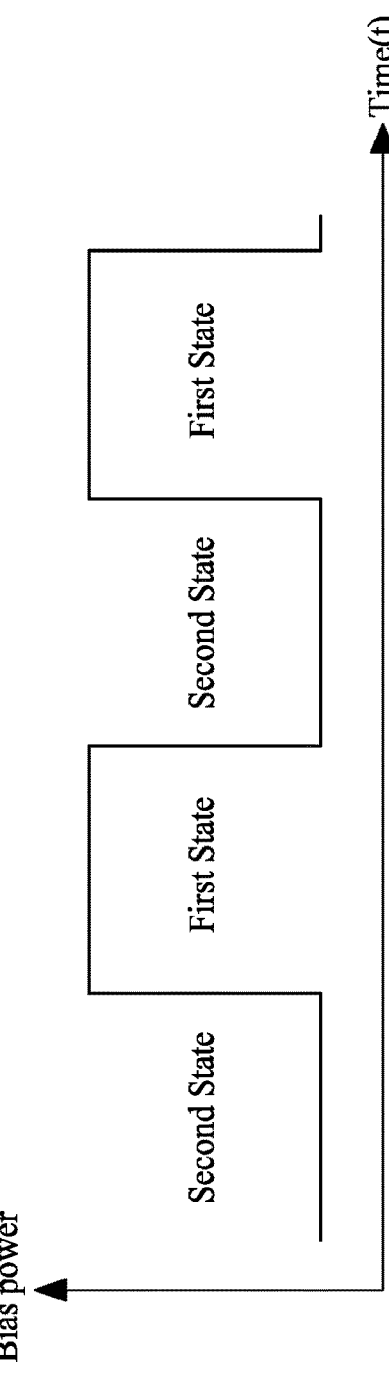
FIG. 2G''

S1'

S11 — Forming a conductive feature in a first passivation layer over a front side of a first substrate S12 — Thinning the first substrate on a back side of the first substrate S13 — Forming a second passivation layer over the back side of the first substrate S14 — Forming a first recess in a top surface of the second passivation layer to expose the conductive feature and forming a recessed portion in a sidewall of the first substrate S15 — Forming an isolation liner in the first recess S16' — Performing a pulsed etching operation to form a polymer liner in the first recess, wherein a top surface of the polymer liner is lower than the back side of the first substrate S17 — Forming a barrier layer and an adhesion layer in the first recess S18 — Forming a conductive material in the first recess to form a through substrate via S19 — Coupling a second substrate to the first substrate by performing a hybrid bonding operation S20 — Forming a top connector over the conductive feature

FIG. 4

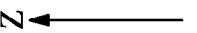
FIG. 5C

SEMICONDUCTOR DEVICE WITH POLYMER LINER AND METHOD FOR FABRICATING THE SAME

CROSS-REFERENCE TO RELATED APPLICATION

This application is a divisional application of U.S. Non-Provisional application Ser. No. 18/385,504 filed Oct. 31, 2023, which is incorporated herein by reference in its entirety.

TECHNICAL FIELD

The present disclosure relates to a semiconductor device and a method for fabricating the semiconductor device, and more particularly, to a semiconductor device with a polymer liner and a method for fabricating the semiconductor device with the polymer liner.

DISCUSSION OF THE BACKGROUND

Semiconductor devices are used in a variety of electronic applications, such as personal computers, cellular phones, digital cameras, and other electronic equipment. As the semiconductor industry has progressed into advanced technology process nodes in pursuit of greater device density, higher performance, and lower costs, challenges of facilitating integration of components with different sizes and complex features have arisen, especially for multi-stack structure devices.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first substrate including a front side and a back side parallel to the front side; a first passivation layer positioned over the front side of the first substrate; a second passivation layer positioned over the back side of the first substrate, wherein the second passivation layer has a top surface facing away from the first substrate; a conductive feature positioned in the first passivation layer, wherein the conductive feature includes a conductive pad and an interconnect structure electrically connected to the conductive pad; a through substrate via (TSV) penetrating through the second passivation layer and the first substrate, wherein the TSV is electrically coupled to the conductive feature; and a polymer liner positioned between the TSV and the first substrate, wherein a top surface of the polymer liner is lower than the top surface of the second passivation layer; a barrier layer positioned between the second passivation layer and the TSV, between the polymer liner and the TSV, and between the interconnect structure and the TSV; and an adhesion layer positioned between the barrier layer and the TSV.

Another aspect of the present disclosure provides a semiconductor device including a first semiconductor chip including a first substrate having a front side and a back side parallel to the front side; a first passivation layer positioned over the front side of the first substrate; a second passivation layer positioned over the back side of the first substrate, wherein the second passivation layer has a top surface facing away from the first substrate; a conductive feature positioned in the first passivation layer; a through substrate via (TSV) exposed through the second passivation layer and electrically coupled to the conductive feature; a polymer liner positioned between the TSV and the first substrate; a barrier layer positioned between the second passivation layer and the TSV, between the polymer liner and the TSV, and between the conductive feature and the TSV; an adhesion layer positioned between the barrier layer and the TSV; and a second semiconductor chip coupled to the first semiconductor chip at a bonding interface and including a second substrate coupled to the first substrate. The polymer liner of the first semiconductor chip is separate from the bonding interface.

Another aspect of the present disclosure provides a method for fabricating a semiconductor device including forming a conductive feature in a first passivation layer over a front side of a first substrate; forming a second passivation layer over a back side of the first substrate; forming a first recess in a top surface of the second passivation layer to expose the conductive feature; conformally forming an isolation liner on a sidewall of the first recess; performing a pulsed etching operation to conformally form a polymer liner on a sidewall of the isolation liner, wherein a top surface of the polymer liner is lower than the top surface of the second passivation layer; conformally forming a barrier layer over the polymer liner and the isolation liner; conformally forming an adhesion layer over the barrier layer; and forming a conductive material in the first recess to form a through substrate via (TSV).

In pursuit of greater device density, distances between adjacent pairs of conductive vias (such as two through substrate vias) become smaller and smaller. As a result, electrical interference may occur and thereby decrease device performance. Further, through substrate vias with smaller dimensions may face reliability issues. For example, a stress concentration issue may cause defects in a device. In addition, it is important to improve a yield of hybrid bonding.

A design of the semiconductor device discussed in the present disclosure, as well as a fabrication method thereof, aim to address the aforesaid issues. Particularly, the present disclosure provides a semiconductor device with a polymer liner and a method of forming the semiconductor device with the polymer liner.

The foregoing has outlined rather broadly the features and technical advantages of the present disclosure in order that the detailed description of the disclosure that follows may be better understood. Additional features and technical advantages of the disclosure are described hereinafter and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIG. 2D' is an enlarged schematic diagram of a dotted region A1 shown in FIG. 2D in accordance with some embodiments of the present disclosure.

FIG. 2F' is an enlarged schematic diagram of a dotted region A2 shown in FIG. 2F in accordance with some embodiments of the present disclosure.

FIG. 2G' shows a bias power-time diagram of a pulsed etching operation in accordance with some embodiments of the present disclosure.

FIG. 2G" shows a bias power-time diagram of a pulsed etching operation in accordance with different embodiments of the present disclosure.

FIG. 4 is a flow diagram illustrating a method of manufacturing a semiconductor device in accordance with some embodiments of the present disclosure.

FIGS. 5A to 5C are cross-sectional diagrams of intermediate stages in the formation of a semiconductor device in accordance with some embodiments of the present disclosure.

DETAILED DESCRIPTION

Figure 1:
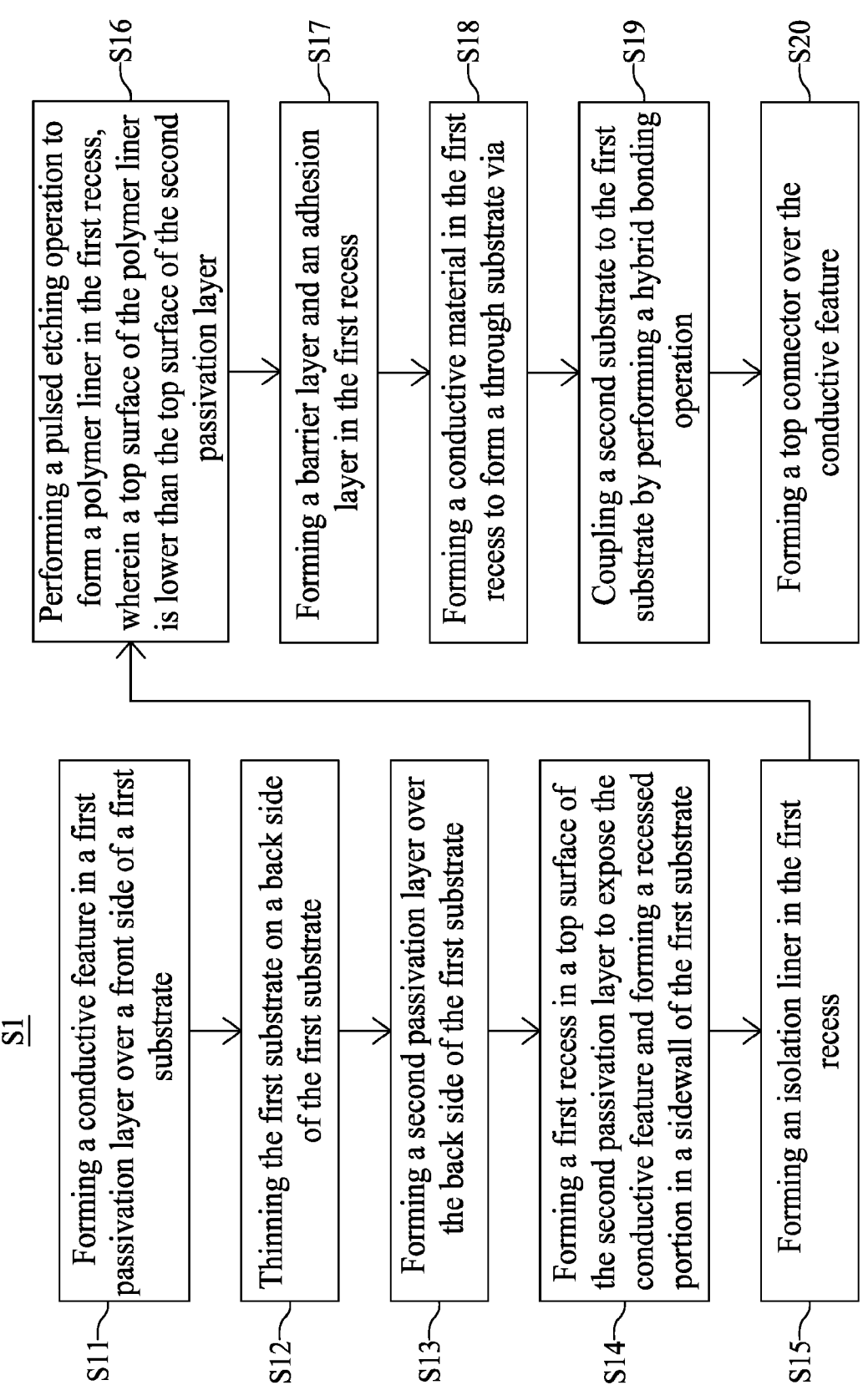
FIG. 1 is a flow diagram illustrating a method of manufacturing a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

In pursuit of greater device density, distances between adjacent pairs of conductive vias (such as two through substrate vias, TSVs) become smaller and smaller. As a result, electrical interference may occur and thereby decrease device performance. Further, through substrate vias with smaller dimensions may face reliability issues. For example, a stress concentration issue may cause defects or anomalies in a semiconductor device. In addition, it is important to improve a yield of hybrid bonding.

Particularly, the present disclosure provides a semiconductor device with a polymer liner and a method for forming the semiconductor device with the polymer liner. Performance of a device formed according to the method and a product yield of the device can both be improved. For example, electrical interference may be alleviated, reliability of through substrate vias can be improved, and the yield of hybrid bonding can be improved.

FIG. 1 is a flow diagram illustrating a method S1 of manufacturing a semiconductor device in accordance with some embodiments of the present disclosure. The method S1 includes a number of operations (S11, S12, S13, S14, S15, S16, S17, S18, S19 and S20) and the description and illustration are not deemed as a limitation to the sequence of the operations. In the operation S11, a conductive feature is formed in a first passivation layer over a front side of a first substrate. In the operation S12, the first substrate is thinned on a back side of the first substrate. In the operation S13, a second passivation layer is formed over the back side of the first substrate. In the operation S14, a first recess is formed in a top surface of the second passivation layer to expose the conductive feature, and a recessed portion is formed in a sidewall of the first substrate. In the operation S15, an isolation liner is formed in the first recess. In the operation S16, a pulsed etching operation is performed to form a polymer liner in the first recess, wherein a top surface of the polymer liner is lower than the top surface of the second passivation layer. In the operation S17, a barrier layer and an adhesion layer are formed in the first recess. In the operation S18, a conductive material is formed in the first recess to form a through substrate via (TSV). In the operation S19, a second substrate is coupled to the first substrate by performing a hybrid bonding operation. In the operation S20, a top connector is formed over the conductive feature.

FIGS. 2A to 2L are schematic diagrams illustrating various fabrication stages constructed according to the method S1 in accordance with some embodiments of the present disclosure. FIG. 2M, FIG. 2N, FIG. 2O and FIG. 3 are schematic diagrams illustrating various devices that may be fabricated by performing operations of the method S1.

Figure 2A:
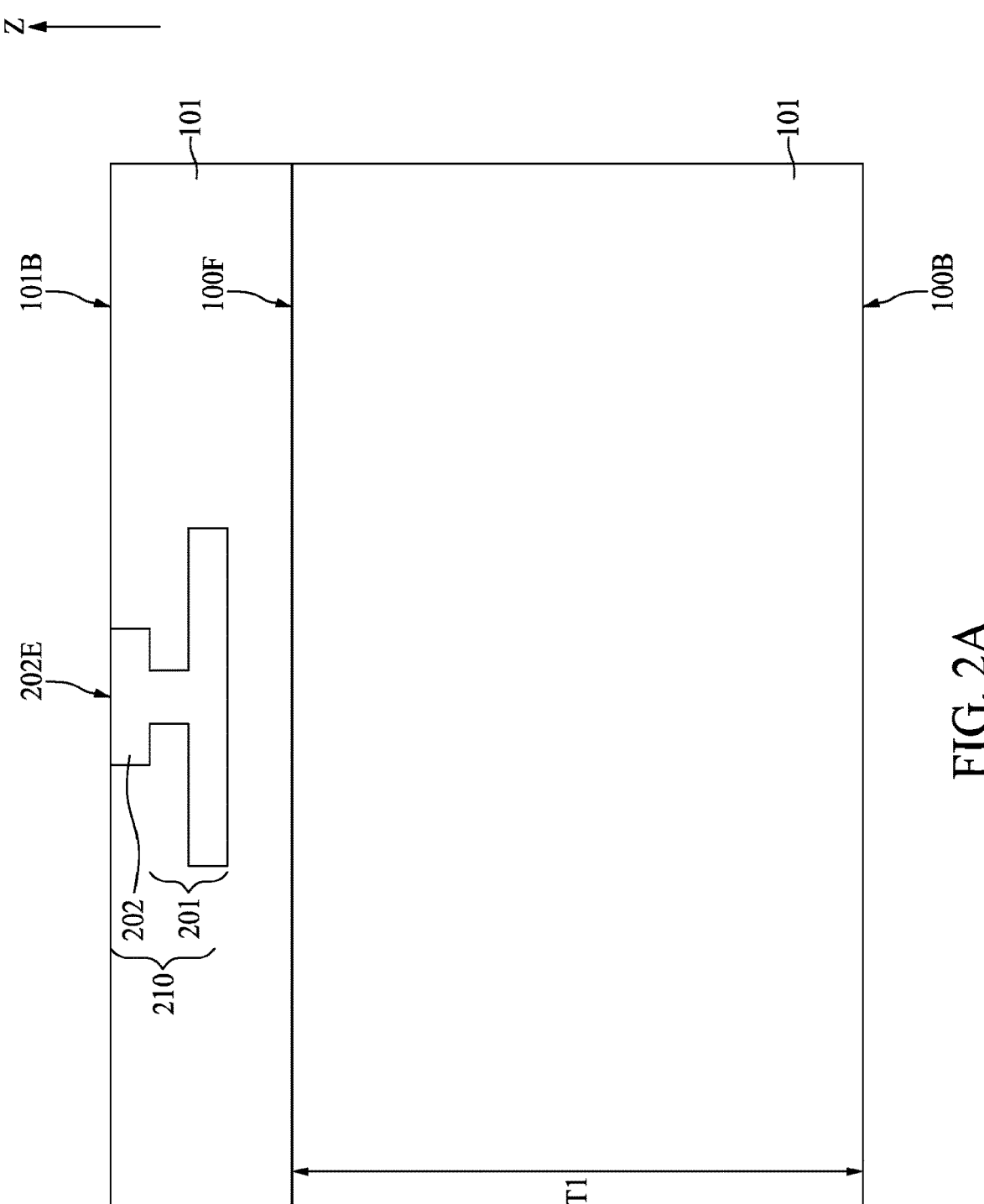
FIGS. 2A to 2D are cross-sectional diagrams of intermediate stages in the formation of a semiconductor device in accordance with some embodiments of the present disclosure.

FIG. 2A is a cross-sectional diagram of an intermediate stage in the formation of a semiconductor device in accordance with some embodiments of the present disclosure. Prior to the operation S11, a first substrate 100 with a first thickness T1 is provided, received, or formed. The first substrate 100 has a front side 100F and a back side 100B opposite to the front side 100F. The front side 100F and the back side 100B are parallel to each other. The front side 100F faces upward and the back side 100B faces downward.

A first passivation layer 101 is formed over the front side 100F of the first substrate 100. In the operation S11, a conductive feature 210 is formed in the first passivation layer 101 over the front side 100F of the first substrate 100. In some embodiments, the conductive feature 210 includes a conductive pad 202 exposed through a back side 101B of the first passivation layer 101, and an interconnect structure 201 electrically connected to the conductive pad 202. The conductive pad 202 and the interconnect structure 201 may be made of conductive materials, such as copper, aluminum copper, other types of metal, or other suitable materials. In some embodiments, a planarization operation, such as a chemical mechanical planarization (CMP) operation, can be performed in the operation S11 on the first passivation layer 101, thus causing an exposed surface 202E of the conductive pad 202 to be coplanar with the back side 101B of the first passivation layer 101.

The first substrate 100 may be a semiconductor substrate, such as a bulk semiconductor, a semiconductor-on-insulator (SOI) substrate, or the like. The first substrate 100 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient SiGe feature in which Si and Ge compositions change from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

In some embodiments, the first substrate 100 may have a multilayer structure, or the first substrate 100 may include a multilayer compound semiconductor structure. In some embodiments, the first substrate 100 includes semiconductor devices, electrical components, electrical elements or a combination thereof. In some embodiments, the first substrate 100 includes transistors or functional units of transistors.

In some embodiments, the first passivation layer 101 includes insulation materials, for example, SiON, SiO$_2$, SiCN, silicon-based material, nitride-based material, oxide-based material, carbide-based material, a combination thereof, or other suitable materials.

Figure 2B:
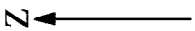

FIG. 2B is a cross-sectional diagram of an intermediate stage in the formation of a semiconductor device in accordance with some embodiments of the present disclosure. In the operation S12, a thinning operation is performed on the back side 100B of the first substrate 100. For example, a thickness of the first substrate 100 is decreased from the first thickness T1 (shown in FIG. 2A) to a second thickness T2, wherein the second thickness T2 is less than the first thickness T1. In some embodiments, the thinning operation of the operation S12 includes grinding on the back side 100B of the first substrate 100.

Figure 2C:

FIG. 2C is a cross-sectional diagram of an intermediate stage in the formation of a semiconductor device in accordance with some embodiments of the present disclosure. In the operation S13, a second passivation layer 102 is formed over the back side 100B of the first substrate 100. The second passivation layer 102 has a top surface 102T facing away from the first substrate 100. In some embodiments, the second passivation layer 102 includes insulation materials, for example, SiON, SiO$_2$, SiCN, silicon-based material, nitride-based material, oxide-based material, carbide-based material, a combination thereof, or other suitable materials. In some embodiments, the first substrate 100 is flipped prior to the operation S13.

Figure 2D:
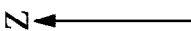
Figure 2D:
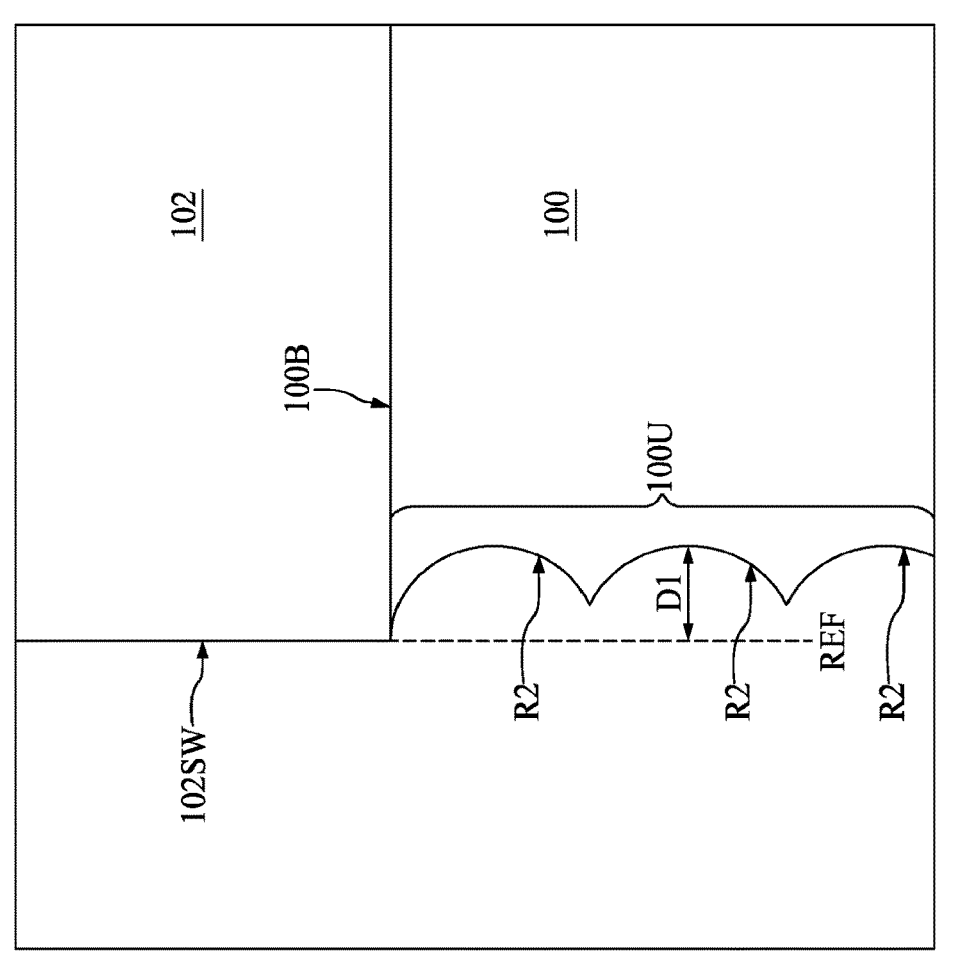

FIG. 2D is a cross-sectional diagram of an intermediate stage in the formation of a semiconductor device in accordance with some embodiments of the present disclosure, and FIG. 2D' is an enlarged schematic diagram of a dotted region A1 shown in FIG. 2D in accordance with some embodiments of the present disclosure. In the operation S14, a first recess R1 is formed by recessing the top surface 102T of the second passivation layer 102. The forming of the first recess R1 may include a lithographic operation and/or an etching operation. In some embodiments, the etching operation includes repeating cycles of: (1) depositing a thin film (not shown) by applying a CF$_x$ plasma, (2) removing a bottom portion of the aforesaid thin film with an anisotropic etching operation, and (3) performing a silicon etching operation with fluorine radicals in SF$_6$ plasma. The above-described etching operation is more suitable for forming deep trenches than some other types of etching operations. After the etching operation is performed, a sidewall 102SW of the second passivation layer 102, a sidewall 100SW of the first substrate 100, and a sidewall 101SW of the first passivation layer 101 are exposed in the first recess R1. As a result, the exposed sidewall 102SW of the second passivation layer 102, the exposed sidewall 100SW of the first substrate 100, and the exposed sidewall 101SW of the first passivation layer 101 can be referred to as the sidewall of the first recess R1. A portion of the conductive feature 210 is under a projection area of the first recess R1. Further, a bottom BT of the first recess R1 may stop at the conductive feature 210. For example, a portion of the interconnect structure 201 is exposed at the bottom BT of the first recess R1.

Further, as shown in FIG. 2D', a recessed portion 100U may also be formed in the operation S14. Specifically, when the aforesaid etching operation is performed, a portion of the first substrate 100 proximal to the back side 100B of the first substrate 100 may be partially removed in a lateral direction. In the embodiments where the first substrate 100 includes silicon, the formation of the recessed portion 100U proximal to the back side 100B of the first substrate 100 can be referred to as "silicon undercut." The recessed portion 100U is at a peripheral area of the first recess R1 in the sidewall 100SW of the first substrate 100. A plurality of second recesses R2 are formed in the recessed portion 100U in the sidewall 100SW of the first substrate 100 in a location that is proximal to the second passivation layer 102. A depth D1 of one second recess R2 (i.e., a distance measured from a tip of the second recess R2 to an imaginary surface REF, wherein the imaginary surface REF is aligned with the sidewall 102SW of the second passivation layer 102) may be between about 100 nm and about 500 nm. If the depth D1 is greater than about 500 nm, the first substrate 100 may suffer from excessive material loss, which may lead to reliability issues.

Figure 2E:
FIGS. 2E and 2F are cross-sectional diagrams of intermediate stages in the formation of a semiconductor device in accordance with some embodiments of the present disclosure.
Figure 2F:
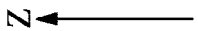

FIGS. 2E and 2F are cross-sectional diagrams of intermediate stages in the formation of a semiconductor device in accordance with some embodiments of the present disclosure. In the operation S15, an isolation liner 206 (shown in FIG. 2F) is formed in the first recess R1. The operation S15 includes a multi-step operation, including forming an isolation liner material layer 206M in the first recess R1 and over the top surface 102T of the second passivation layer 102 (shown in FIG. 2E) and partially removing the isolation liner material layer 206M to form the isolation liner 206 (shown in FIG. 2F). In some embodiments, a blanket deposition is performed to form the isolation liner material layer 206M both in the first recess R1 and over the top surface 102T of the second passivation layer 102. The isolation liner material layer 206M includes (1) a top portion 206T over the top surface 102T of the second passivation layer 102, (2) a sidewall portion 206S lining the sidewall of the first recess R1 (that is, lining the sidewall 100SW of the first substrate 100, the sidewall 101SW of the first passivation layer 101, and the sidewall 102SW of the second passivation layer 102), and (3) a bottom portion 206B at the bottom BT of the first recess R1 and over the interconnect structure 201.

In some embodiments, a material of the isolation liner material layer 206M includes oxide-based material, nitride-base material, or another suitable material, which can be selected from materials with low dielectric constant.

Still referring to the operation S15, an etching operation is performed to remove the top portion 206T and the bottom portion 206B of the isolation liner material layer 206M, wherein a remaining portion, i.e., the sidewall portion 206S of the isolation liner material layer 206M, constitutes the isolation liner 206. The isolation liner 206 is thereby formed over the sidewall 100SW of the first substrate 100, over the sidewall 101SW of the first passivation layer 101, and over the sidewall 102SW of the second passivation layer 102. In some embodiments, an upper portion of the sidewall portion 206S of the isolation liner material layer 206M may also be partially removed, but the present disclosure is not limited thereto.

FIG. 2F' is an enlarged schematic diagram of a dotted region A2 shown in FIG. 2F in accordance with some embodiments of the present disclosure. Following the discussion in reference to FIGS. 2E and 2F, the isolation liner 206 is also formed in the second recesses R2 in the recessed portion 100U. The isolation liner 206 includes a plurality of protrusions 206P in the second recesses R2, wherein the protrusions 206P protrude toward the first substrate 100. The protrusions 206P are in physical contact with the first substrate 100. A height D2 of one protrusion 206P may correspond to the depth D1 shown in FIG. 2D', which is between about 100 nm and about 500 nm. The depth D2 may be greater than 100 nm so that the adhesion between the isolation liner 206 and the first substrate 100 can be enhanced, thereby improving a reliability of the semiconductor device.

In the operation S16, a polymer liner 205 is formed in the first recess R1. The forming of the polymer liner 205 is discussed below in reference to FIGS. 2G to 2H.

Figure 2G:
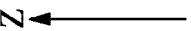
FIG. 2G is a cross-sectional diagram of an intermediate stage in the formation of a semiconductor device in accordance with some embodiments of the present disclosure.

FIG. 2G is a cross-sectional diagram of an intermediate stage in the formation of a semiconductor device in accordance with some embodiments of the present disclosure. A polymer material layer 205M is formed in the first recess R1 and over a sidewall 206SW of the isolation liner 206. The forming of the polymer material layer 205M includes supplying a carbon-based chemical over the first recess R1. In some embodiments, the carbon-based chemical may be carbon-rich gas, such as $C_4F_8$ or $C_4F_6$. In some alternative embodiments, the carbon-based chemical may be carbon monoxide (CO). A material of the polymer material layer 205M may be fluorine-based polymer, which also includes carbon. A dielectric constant of the polymer material layer 205M may be less than 3.5. The polymer material layer 205M is formed over the isolation liner 206. In some embodiments, the polymer material layer 205M is formed by a pulsed etching operation, which includes a plurality of repeating cycles of (1) partially removing the polymer material in a first state, and (2) depositing the polymer material in a second state. By properly controlling a removal rate in the first state and a deposition rate in the second state, the polymer material layer 205M can be shaped in a desired fashion. The pulsed etching operation may include repeatedly altering a bias power over time, as discussed in reference to FIG. 2G' or FIG. 2G", while controlling various factors or conditions of the pulsed etching operation (such as temperature, etching time, etc.). Further, the polymer material layer 205M may be formed in different fashions at different positions. In some embodiments, a removal rate of the polymer material layer 205M proximal to an opening of the first recess R1 may be greater than a removal rate at a lower position of the first recess R1.

FIG. 2G' shows a bias power-time diagram of a pulsed etching operation in accordance with some embodiments of the present disclosure. A first type of pulsed etching operation is depicted in FIG. 2G'. In the first type of pulsed etching operation, the step of (1) partially removing the polymer material in the first state is performed first, followed by the step of (2) depositing the polymer material in the second state. In the first state, higher bias power is applied, wherein the reactant is disassociated. In the second state, the bias power is decreased, thereby causing the reactant to be in an atomic state and able to be deposited in solid form over a surface. A switching interval of the bias power in the first type of pulsed etching operation may be between about $10^{-4}$ s and about 10 s. That is, the first state and the second state are alternately and repeatedly switched with a switching interval in the range between about $10^{-4}$ s and about 10 s.

FIG. 2G" shows a bias power-time diagram of a pulsed etching operation in accordance with different embodiments of the present disclosure. A second type of pulsed etching operation is depicted in FIG. 2G". The second type of pulsed etching operation is similar to the first type of pulsed etching operation discussed in reference to FIG. 2G', with a difference in that the step of (2) depositing the polymer material in the second state is instead performed prior to the step of (1) partially removing the polymer material in the first state. A switching interval of the bias power in the second type of pulsed etching operation may be between about $10^{-4}$ s and about 10 s. That is, the first state and the second state are alternately and repeatedly switched with a switching interval in the range between about $10^{-4}$ s and about 10 s.

Referring back to FIG. 2G, by performing the first type of pulsed etching operation as discussed in reference to FIG. 2G' or the second type of pulsed etching operation as discussed in reference to FIG. 2G", a shape of the polymer material layer 205M can be controlled. Accordingly, the initial deposited polymer material layer 205M includes a lower portion 205L and an upper portion 205H above the lower portion 205L, wherein the upper portion 205H is proximal to the top surface 102T of the second passivation layer 102. During the pulsed etching operation (either the first type or the second type of pulsed etching operation), a removal rate of the upper portion 205H is greater than a deposition rate of the upper portion 205H, while a deposition rate of the lower portion 205L is greater than a removal rate of the lower portion 205L. Further, a removal rate of polymer material at the bottom BT of the first recess R1 is greater than the deposition rate of the polymer material, thus the interconnect structure 201 may remain exposed to the first recess R1 after the pulsed etching operation. A result of the shaping of the polymer material layer 205M into the polymer liner 205 is illustrated in FIG. 2H.

Figure 2H:
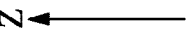
FIGS. 2H to 2L are cross-sectional diagrams of intermediate stages in the formation of a semiconductor device in accordance with some embodiments of the present disclosure.

FIG. 2H is a cross-sectional diagram of an intermediate stage in the formation of a semiconductor device in accordance with some embodiments of the present disclosure. The polymer liner 205 formed from the polymer material layer 205M is deposited in the first recess R1. As a result, the polymer liner 205 has a top surface 205T lower than the top surface 102T of the second passivation layer 102. A portion of the isolation liner 206 may be exposed above the polymer liner 205. In some embodiments, as shown in FIG. 2H, the top surface 205T of the polymer liner 205 is above the back side 100B of the first substrate 100. In some embodiments, the polymer liner 205 includes a first portion 205FP that is laterally surrounded by the second passivation layer 102, and a second portion 205SP that is laterally surrounded by the first substrate 100 and a portion of the first passivation layer 101. The first portion 205FP is above the second portion 205SP. The first portion 205FP is above the back side 100B of the first substrate 100. In some embodiments, the polymer liner 205 has a thickness TK1 that is between about 50 nm and about 500 nm. The second portion 205SP of the polymer liner 205 is in direct contact with the interconnect structure 201 of the conductive feature 210. A material of the polymer liner 205 may include fluorine-based polymer, which also includes carbon. A dielectric constant of the polymer liner 205 may be less than 3.5.

Figure 2I:
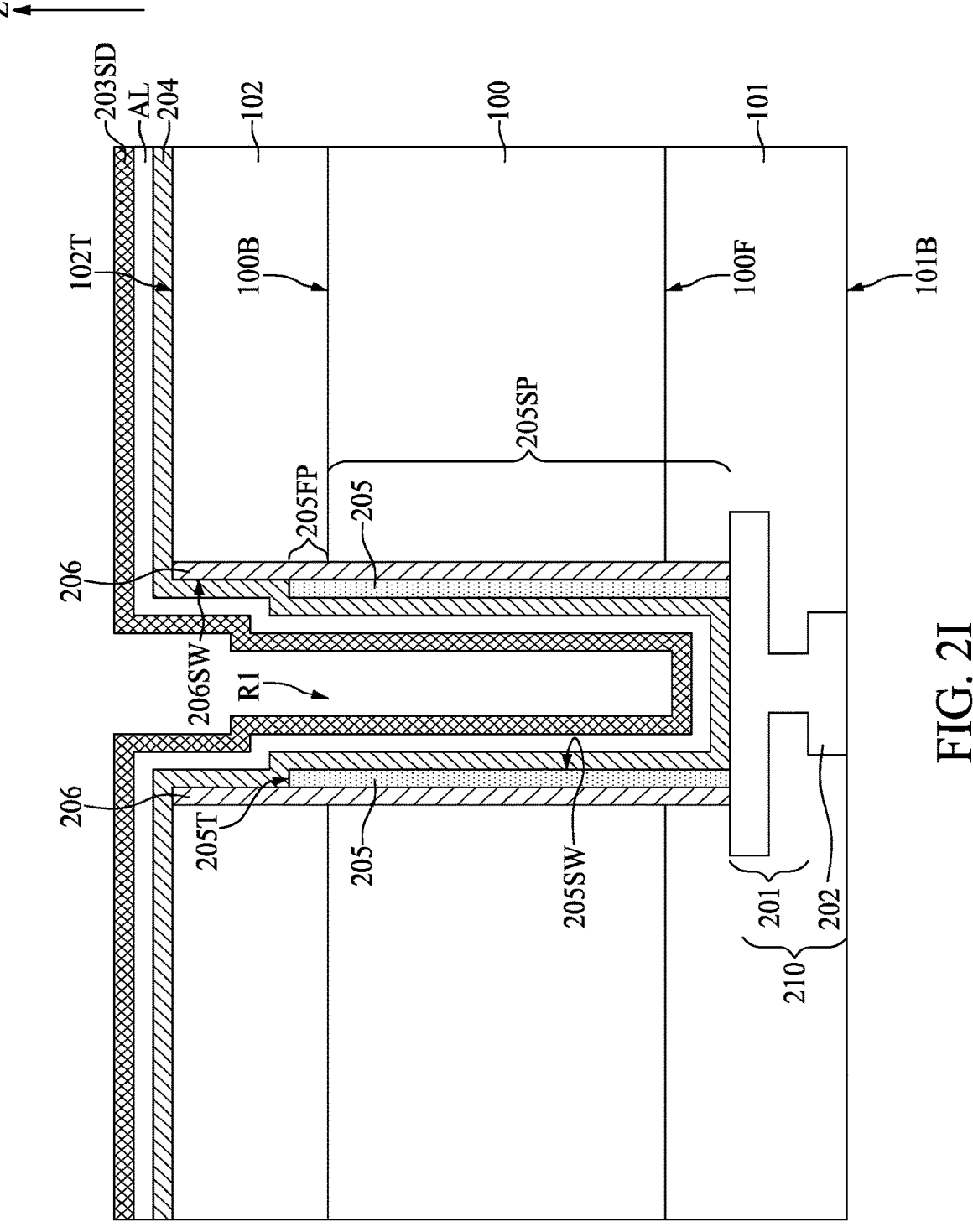

FIG. 2I is a cross-sectional diagram of an intermediate stage in the formation of a semiconductor device in accordance with some embodiments of the present disclosure. In the operation S17, a barrier layer 204 is formed in the first recess R1. In some embodiments, the barrier layer 204 is formed by blanket deposition. The barrier layer 204 is formed over the top surface 102T of the second passivation layer 102, over a sidewall 205SW of the polymer liner 205, over the top surface 205T of the polymer liner 205, over the sidewall 206SW of the isolation liner 206, and over the interconnect structure 201 that is exposed at the bottom BT of the first recess R1. In some embodiments, the barrier layer 204 may include cobalt, titanium, titanium nitride, ruthenium, tantalum, tantalum nitride, indium oxide, tungsten nitride, titanium nitride, nickel boride, tantalum nitride/tantalum bilayer, or other suitable materials.

In the operation S17, an adhesion layer AL is formed in the first recess R1. In some embodiments, the adhesion layer AL is formed by blanket deposition. In some embodiments, the adhesion layer AL is formed by a deposition process such as physical vapor deposition, atomic layer deposition, chemical vapor deposition, sputtering, or other suitable deposition processes. The adhesion layer AL is conformally formed over the barrier layer 204. In some embodiments, the adhesion layer AL may include, for example, titanium, tantalum, titanium tungsten, or manganese nitride. The adhesion layer AL may improve an adhesion between the barrier layer 204 and the seed layer 203SD, which is described below. In some embodiments, the adhesion layer AL has a thickness between about 5 nm and about 50 nm.

After the operation S17 is performed, a seed layer 203SD can be formed over the adhesion layer AL. In some embodiments, the seed layer 203SD has a thickness between about 10 nm and about 40 nm. In some embodiments, the seed layer 203SD is formed of, for example, copper or ruthenium. In some embodiments, the seed layer 203SD is formed by a deposition process such as physical vapor deposition, atomic layer deposition, chemical vapor deposition, sputtering, or other suitable deposition processes. In some embodiments, the seed layer 203SD can reduce resistivities of the first recess R1 during formation of a conductive material 203M, which is described below.

Figure 2J:
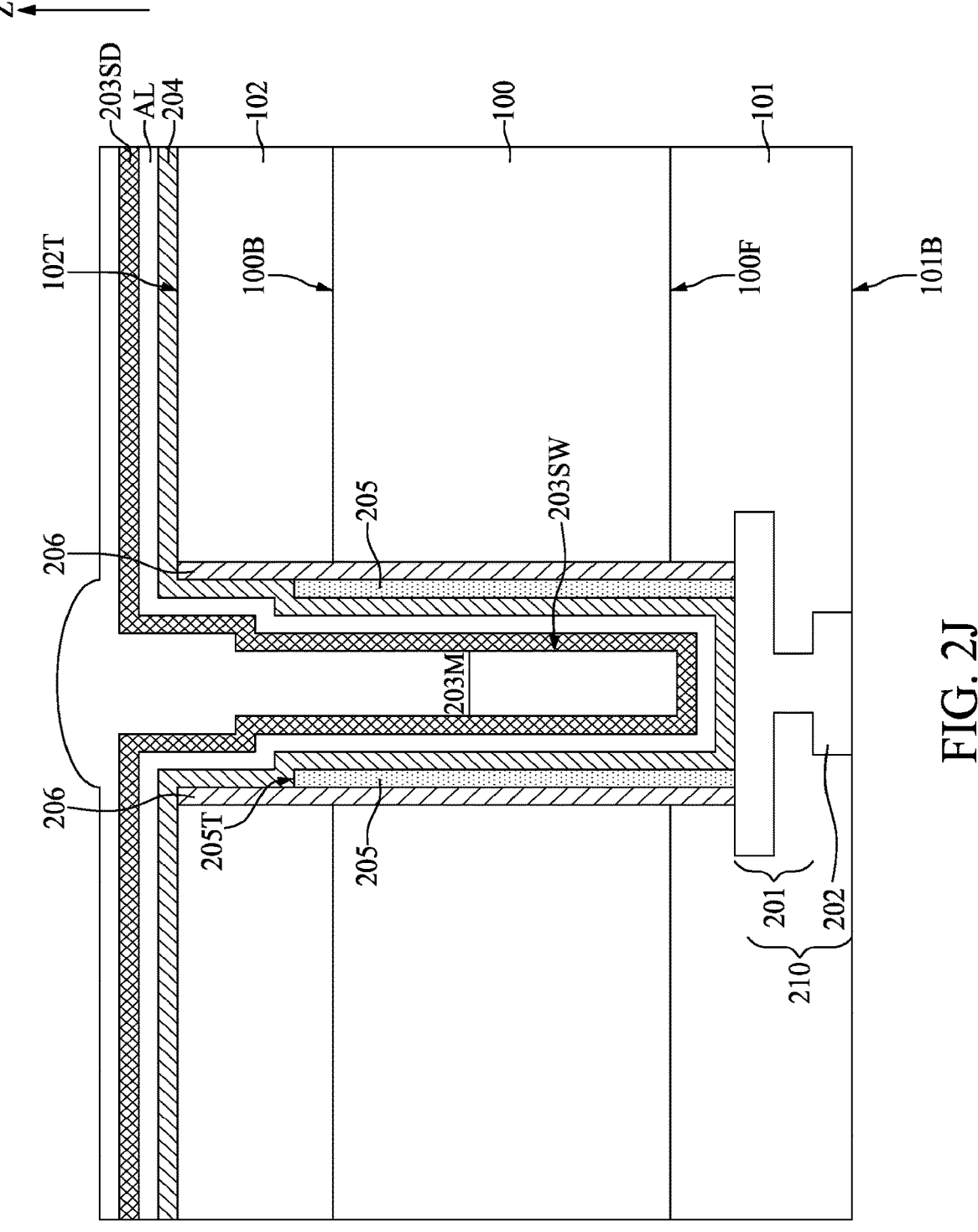
Figure 2K:
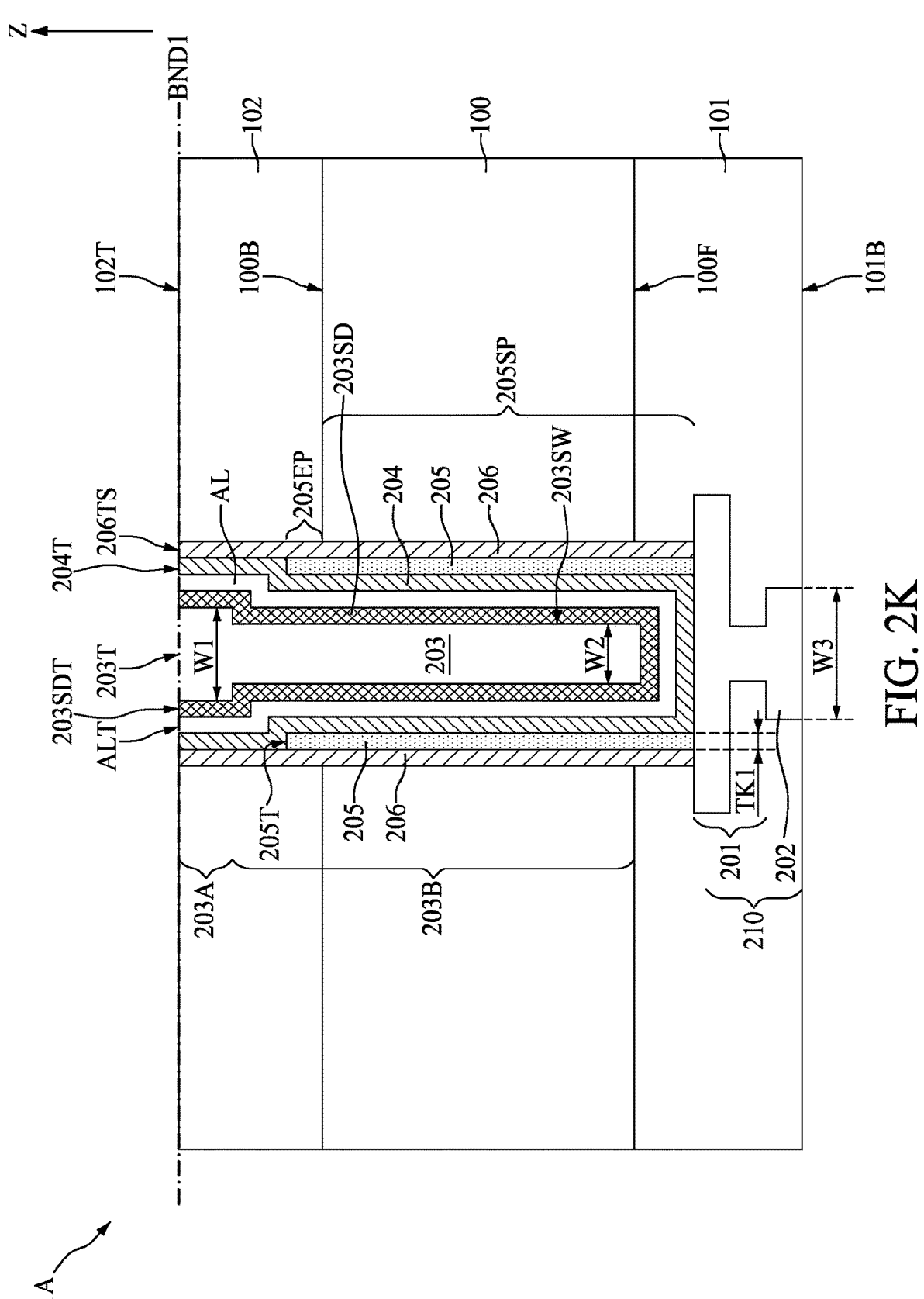

In the operation S18, the conductive material 203M is formed in the first recess R1 in order to form a through substrate via (TSV) 203, which is described in reference to FIGS. 2J and 2K.

FIG. 2J is a cross-sectional diagram of an intermediate stage in the formation of a semiconductor structure in accordance with some embodiments of the present disclosure. In the operation S18, the conductive material 203M (such as copper or other types of metal, alloy, or the like) is formed in the first recess R1 and over the top surface 102T of the second passivation layer 102. In some embodiments, the conductive material 203M can be formed by electroplating, electroless plating, sputtering, or other types of deposition operations.

FIG. 2K is a cross-sectional diagram of an intermediate stage in the formation of a semiconductor device in accordance with some embodiments of the present disclosure. The operation S18 further includes a planarization operation, such as a chemical mechanical planarization (CMP) operation. By using the planarization operation, an excess portion of the conductive material 203M can be removed in order to form the TSV 203, thereby forming a first semiconductor chip 1A. After the planarization operation is performed, a top surface 203T of the TSV 203 is coplanar with the top surface 102T of the second passivation layer 102, a top surface 204T of the barrier layer 204, a top surface 203SDT of the seed layer 203SD, a top surface ALT of the adhesion layer AL, and a top surface 206TS of the isolation liner 206. Accordingly, the top surface 203T of the TSV 203, the top surface 102T of the second passivation layer 102, the top surface 204T of the barrier layer 204, the top surface 203SDT of the seed layer 203SD, the top surface ALT of the adhesion layer AL, and the top surface 206TS of the isolation liner 206 are collectively referred to as a first bonding surface BND1. In some embodiments, the top surface 205T of the polymer liner 205 is separate from the first bonding surface BND1. Accordingly, the polymer liner 205 is free of being exposed through the first bonding surface BND1. Further, the barrier layer 204 conforms to a sidewall 203SW of the TSV 203. The barrier layer 204 extends between the polymer liner 205 and the TSV 203. The adhesion layer AL conforms to the barrier layer 204. The adhesion layer AL is disposed between the barrier layer 204 and the TSV 203. The seed layer 203SD conforms to the adhesion layer AL. The seed layer 203SD is disposed between the adhesion layer AL and the TSV 203. In some embodiments, the seed layer 203SD is formed of a same material as the TSV 203 and is referred to as part of the TSV 203.

The TSV 203 is electrically coupled to the interconnect structure 201 of the conductive feature 210. The TSV 203 penetrates through the second passivation layer 102 and the first substrate 100. The TSV 203 may have a first portion 203A and a second portion 203B, wherein a width W1 of the first portion 203A is greater than a width W2 of the second portion 203B. The first portion 203A is above the second portion 203B, and the second portion 203B penetrates through the first substrate 100. In some embodiments, the width W1 of the first portion 203A is less than a width W3 of the conductive pad 202. In some embodiments, the width W1 of the first portion 203A is equal to or greater than the width W3 of the conductive pad 202.

The first semiconductor chip 1A can be utilized in various types of semiconductor devices, such as dynamic random-access memory (DRAM), three-dimensional integrated circuits (3DIC), memory stacks, logic stacks, memory devices, and the like. In some embodiments, in order to form the semiconductor device, the first semiconductor chip 1A can be stacked with other semiconductor chips or semiconductor structures. Some embodiments will be respectively discussed with reference to FIGS. 2L to 2M, FIG. 2N, FIG. 2O and FIG. 3.

In the operation S19, the first semiconductor chip 1A is coupled to a second semiconductor chip 1A'. In some embodiments, the first semiconductor chip 1A is bonded to the second semiconductor chip 1A' by performing a hybrid bonding operation. In some embodiments, a configuration of the second semiconductor chip 1A' can be similar to that of the first semiconductor chip 1A. The second semiconductor chip 1A' includes a second substrate 100' that is similar to the first substrate 100. The first substrate 100 of the first semiconductor chip 1A is coupled to the second substrate 100' of the second semiconductor chip 1A' through the hybrid bonding operation. In the examples depicted in FIGS. 2L to 2M, FIG. 2N, FIG. 2O and FIG. 3, the second semiconductor chip 1A' is substantially identical to the first semiconductor chip 1A, and the second substrate 100' is substantially identical to the first substrate 100. However, it should be understood that a design of the second semiconductor chip 1A' and a design of the second substrate 100' may also be changed.

Figure 2L:
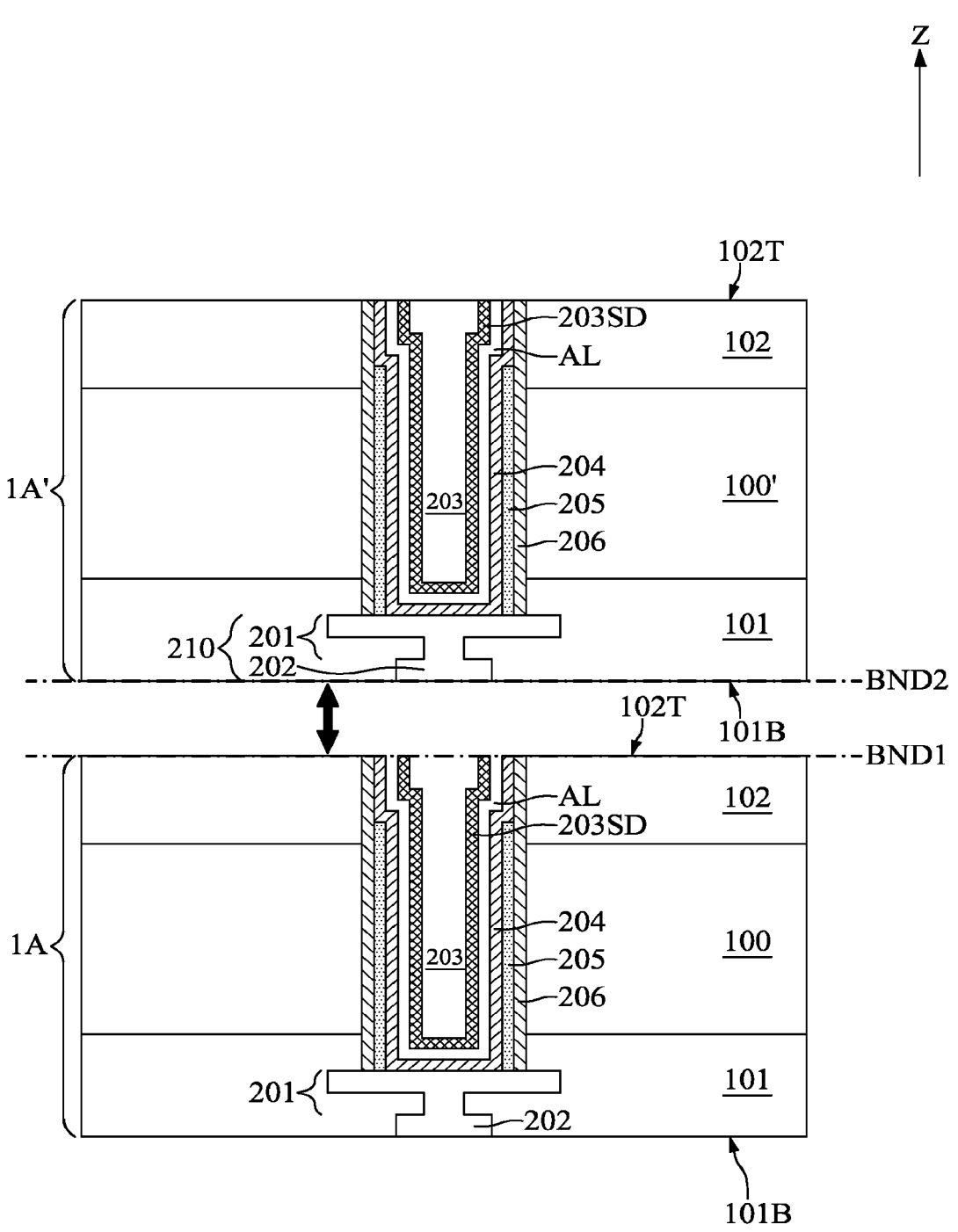

FIG. 2L is a cross-sectional diagram of an intermediate stage in the formation of a semiconductor device in accordance with some embodiments of the present disclosure. The operation S19 includes aligning the first semiconductor chip 1A with the second semiconductor chip 1A', wherein the first bonding surface BND1 of the first semiconductor chip 1A faces a second bonding surface BND2 of the second semiconductor chip 1A'. As in the first semiconductor chip 1A, in the second semiconductor chip 1A', a conductive pad 202 may be exposed through a back side 101B of the first passivation layer 101 of the second semiconductor chip 1A' and exposed through the second bonding surface BND2.

Figure 2M:
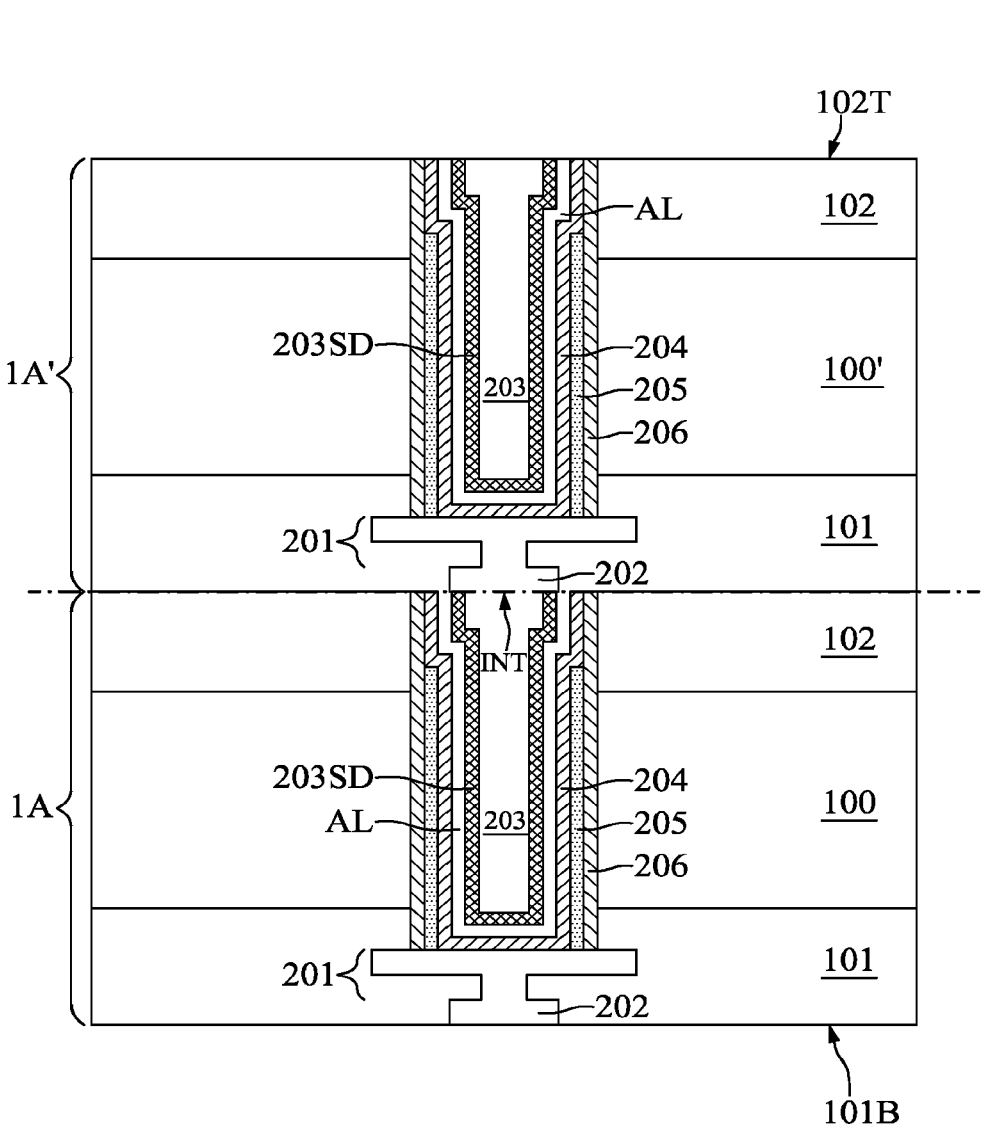
FIGS. 2M, 2N, 2O and 3 are cross-sectional views of semiconductor devices in accordance with some embodiments of the present disclosure.

FIG. 2M is a cross-sectional view of a semiconductor device in accordance with some embodiments of the present disclosure. The operation S19 includes coupling the first semiconductor chip 1A to the second semiconductor chip 1A'. Firstly, the first bonding surface BND1 of the first semiconductor chip 1A is attached to the second bonding surface BND2 of the second semiconductor chip 1A' at a bonding interface INT at a first temperature (which can be around room temperature, such as about 25° C.). Secondly, the first semiconductor chip 1A and the second semiconductor chip 1A' are annealed at a second temperature that is greater than the first temperature, so that the first semiconductor chip 1A can be bonded to the second semiconductor chip 1A' by a hybrid bonding operation. In some embodiments, the second temperature is between about 200° C. and 350° C. The TSV 203 of the first semiconductor chip 1A is in direct contact with the first passivation layer 101 of the second semiconductor chip 1A'.

Figure 2N:
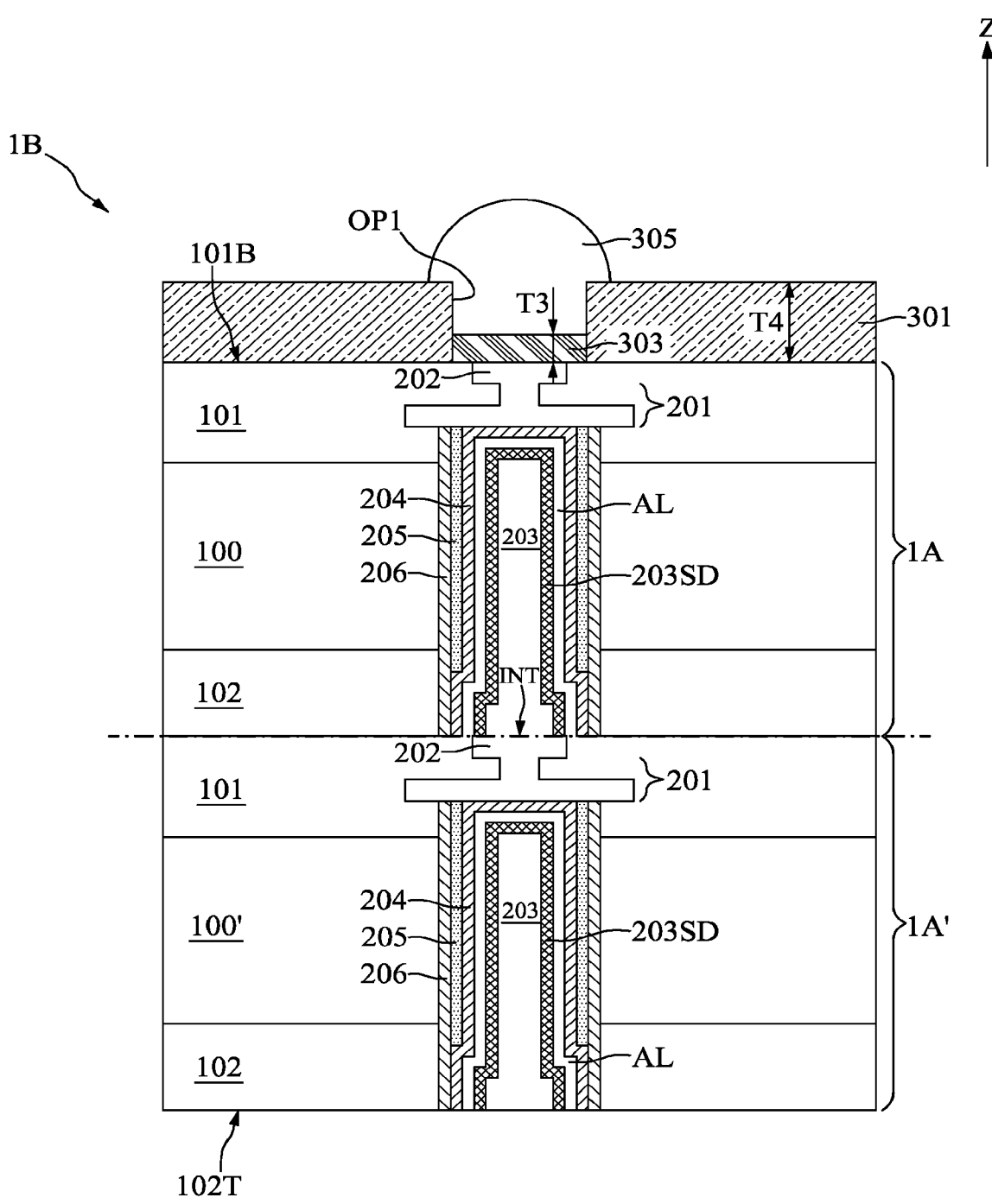

FIG. 2N is a cross-sectional view of a semiconductor device in accordance with some embodiments of the present disclosure. The operation S20 includes forming a top connector 305 over the interconnect structure 201 of the first semiconductor chip 1A. The intermediate semiconductor device illustrated in FIG. 2M is flipped prior to the operation S20. Subsequently, the back side 101B of the first passivation layer 101 of the first semiconductor chip 1A faces upward. A top passivation layer 301 is formed over the back side 101B of the first passivation layer 101 of the first semiconductor chip 1A. An opening OP1 is formed penetrating the top passivation layer 301 to expose the conductive pad 202 of the first semiconductor chip 1A. A top barrier layer 303 is formed over the conductive pad 202 of the first semiconductor chip 1A and within the opening OP1. The top connector 305 is formed over the top barrier layer 303 and completely fills the opening OP1. After the top connector 305 is formed, the semiconductor device 1B is obtained.

In some embodiments, the top passivation layer 301 is a single layer structure or a multi-layer structure. In some embodiments, the top passivation layer 301 includes poly-benzoxazole, polyimide, benzocyclobutene, solder resist film, the like, or a combination thereof. A polymeric material (e.g., polyimide) may have a number of attractive characteristics such as an ability to fill openings of high aspect ratio, a relatively low dielectric constant (about 3.2), a simple deposition process, a reduction of sharp features or steps in an underlying layer, and high temperature tolerance after curing. In addition, some photosensitive polymeric material (e.g., photosensitive polyimide) may have all the aforementioned characteristics, may be patterned like a photoresist mask, and may, after patterning and etching, remain on a surface on which the photosensitive polymeric material has been deposited to serve as part of a passivation layer. In some other embodiments, the top passivation layer 301 may be a dielectric layer. The dielectric layer may include a nitride such as silicon nitride, an oxide such as silicon oxide, an oxynitride such as silicon oxynitride, silicon nitride oxide, phosphosilicate glass, borosilicate glass, boron-doped phosphosilicate glass, the like, or a combination thereof.

In some embodiments, the opening OP1 is formed penetrating the top passivation layer 301 to expose the conductive pad 202 and a portion of the back side 101B of the first passivation layer 101 of the first semiconductor chip 1A. In some embodiments, a sidewall of the opening OP1 is substantially vertical. In some embodiments, the sidewall of the opening OP1 is tapered. It should be noted that, in the description of the present disclosure, a surface is "substantially vertical" if there exists a vertical plane from which the surface does not deviate by more than three times the root mean square roughness of the surface.

In some embodiments, the top barrier layer 303 is formed over the conductive pad 202 and within the opening OP1. The top barrier layer 303 may have a thickness T3 less than a thickness T4 of the top passivation layer 301. The top barrier layer 303 includes, for example, aluminum fluoride. Due to its saturated bonding property, aluminum fluoride is stable and may protect the underlying conductive pad 202 from corrosion due to various semiconductor processes, especially those processes that include fluorine ions. In some embodiments, the top barrier layer 303 may further include zinc oxide, which may improve electrical properties of the top barrier layer 303. In some embodiments, a concentration of zinc oxide in the top barrier layer 303 may be greater than a concentration of aluminum fluoride in the top barrier layer 303.

In some embodiments, the top connector 305 is formed over the top barrier layer 303 and the top passivation layer 301 and completely fills the opening OP1. A lower portion of the top connector 305 extends into the top passivation layer 301, completely fills the opening OP1, and is disposed over the top barrier layer 303. An upper portion of the top connector 305 protrudes from a plane coplanar with a top surface of the top passivation layer 301, covers the lower portion of the top connector 305, and covers a portion of the top surface of the top passivation layer 301 near the opening OP1. In some embodiments, the top connector 305 includes, for example, a conductive material with low resistivity, such as tin, lead, silver, copper, nickel, bismuth or an alloy thereof.

In some embodiments, the top connector 305 is a solder joint. The solder joint includes a material such as tin, or another suitable material such as silver or copper. In an embodiment in which the solder joint is a tin solder joint, the solder joint is formed by initially forming a layer of tin through evaporation, electroplating, printing, solder transfer, or ball placement to a thickness of about 10 μm to about 100 μm. Once the layer of tin has been formed, fills the opening OP1 and protrudes above the top passivation layer 301, a reflow process may be performed to shape the solder joint into a desired shape.

In some embodiments, the polymer liner 205 is separate from the bonding interface INT, so a reliability of the hybrid bonding operation in terms of adhesion between the first semiconductor chip 1A and the second semiconductor chip 1A' is improved, and a negative impact on electrical properties of the semiconductor device 1B is alleviated or limited.

Conventional bonding operations face issues caused by expansion of conductive materials at operation temperatures of hybrid bonding. Deformation of conductive materials may cause bonding surfaces to have a non-uniform profile, leading to poor adhesion between two chips.

In order to address the aforesaid issues, the present disclosure provides a semiconductor device with a polymer liner 205. Specifically, due to its great flexibility, the polymer liner 205 can reduce a deformation of the TSV 203 or buffer a negative effect caused by deformation of the TSV 203. Accordingly, a degree of deformation of the TSV 203 (especially in a vertical direction) can be decreased, and a stress concentration in the TSV 203 can be alleviated. As a result, a yield of the hybrid bonding operation can be improved.

Figure 2O:
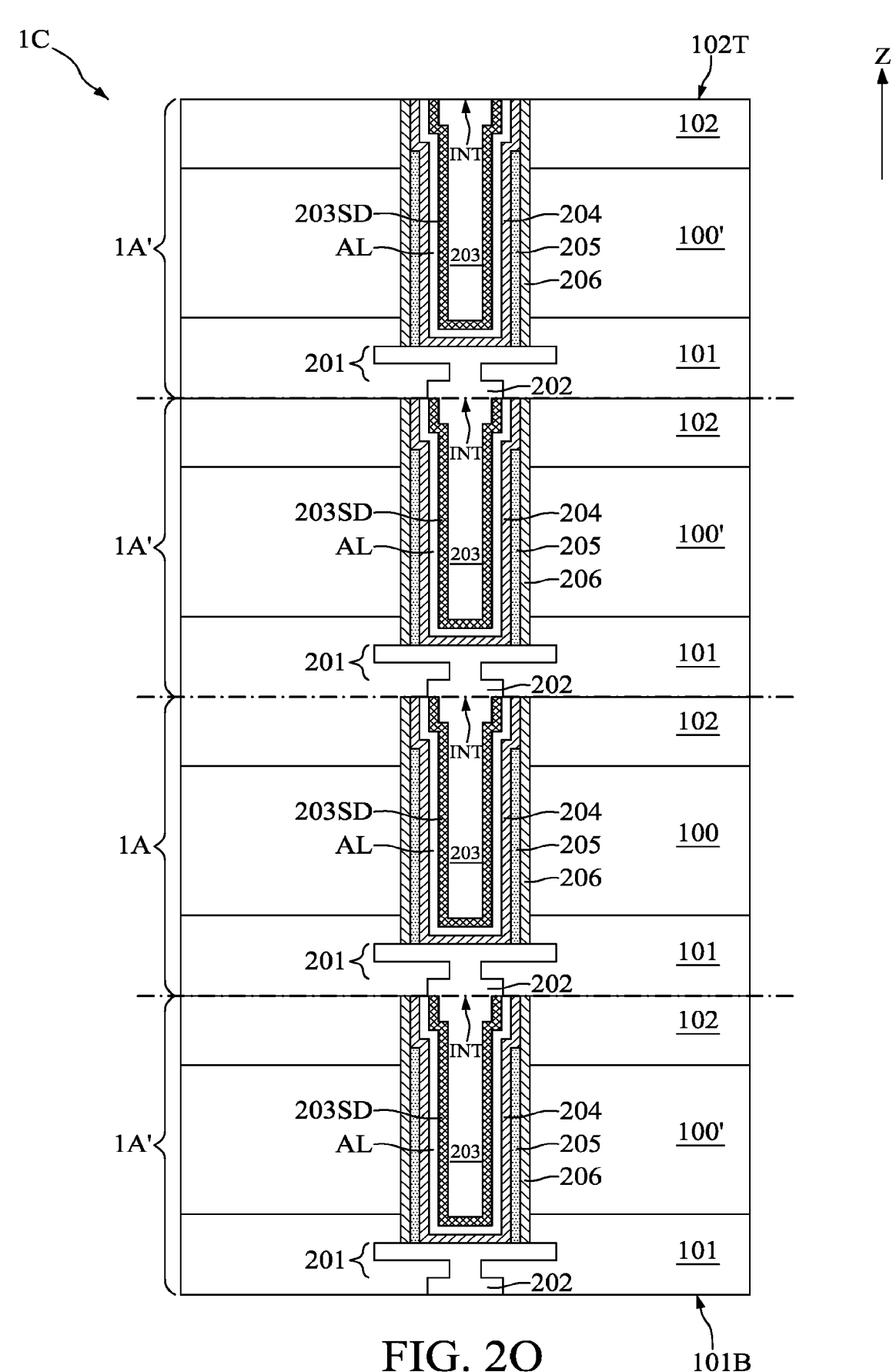

FIG. 2O is a cross-sectional view of a semiconductor device in accordance with some embodiments of the present disclosure. The semiconductor device 1C depicted in FIG. 2O is similar to the semiconductor device depicted in FIG. 2M. A difference resides in that the semiconductor device 1C includes more than two semiconductor chips in a stack. For example, one first semiconductor chip 1A is coupled to more than one second semiconductor chip 1A' (please refer to the discussion in reference to FIGS. 2K to 2N). The hybrid bonding operation can be repeated. It should be understood that, as a number of semiconductor chips in a stack is increased, the deformations of the TSVs 203 may compound, thus aggravating a tolerance issue regarding the hybrid bonding. Accordingly, the present disclosure provides resolutions to such issues for multi-chip stack configurations.

Figure 3:

FIG. 3 is a cross-sectional view of a semiconductor device in accordance with some embodiments of the present disclosure. The semiconductor device 1D depicted in FIG. 3 is similar to the semiconductor device depicted in FIG. 2M. A difference resides in that each of the first semiconductor chip 1A and the second semiconductor chip 1A' can have two or more TSVs 203.

In pursuit of greater device density, distances between adjacent pairs of TSVs 203 become smaller and smaller. Accordingly, inclusion of the polymer liner 205 can help alleviate electrical interference, thereby improving device performance.

FIG. 4 is a flow diagram illustrating a method of manufacturing a semiconductor device in accordance with some embodiments of the present disclosure. The method S1' includes a number of operations (S11, S12, S13, S14, S15, S16', S17, S18, S19 and S20) and the description and illustration are not deemed as a limitation to the sequence of the operations. In the operation S11, a conductive feature is formed in a first passivation layer over a front side of a first substrate. In the operation S12, the first substrate is thinned from a back side of the first substrate. In the operation S13, a second passivation layer is formed over the back side of the first substrate. In the operation S14, a first recess is formed in a top surface of the second passivation layer to expose the conductive feature, and a recessed portion is formed in a sidewall of the first substrate. In the operation S15, an isolation liner is formed in the first recess. In the operation S16', a pulsed etching operation is performed to form a polymer liner in the first recess, wherein a top surface of the polymer liner is lower than the back side of the first substrate. In the operation S17, a barrier layer and an adhesion layer are formed in the first recess. In the operation S18, a conductive material is formed in the first recess in order to form a through substrate via (TSV). In the operation S19, a second substrate is coupled to the first substrate by performing a hybrid bonding operation. In the operation S20, a top connector is formed over the conductive feature.

Figure 5A:
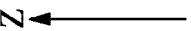
Figure 5B:
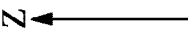
Figure 5D:
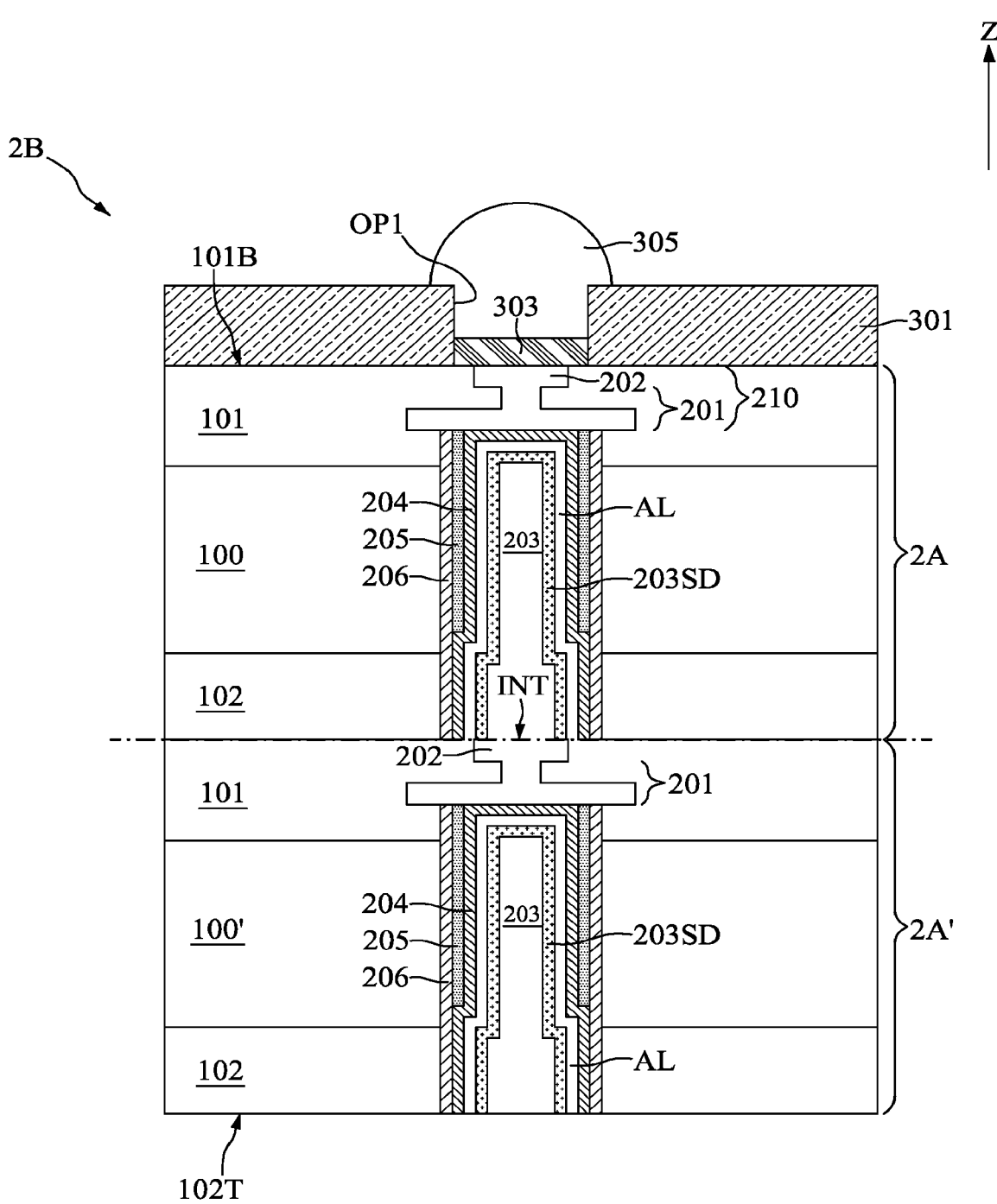
FIG. 5D is a cross-sectional view of a semiconductor device in accordance with some embodiments of the present disclosure.
Figure 5E:
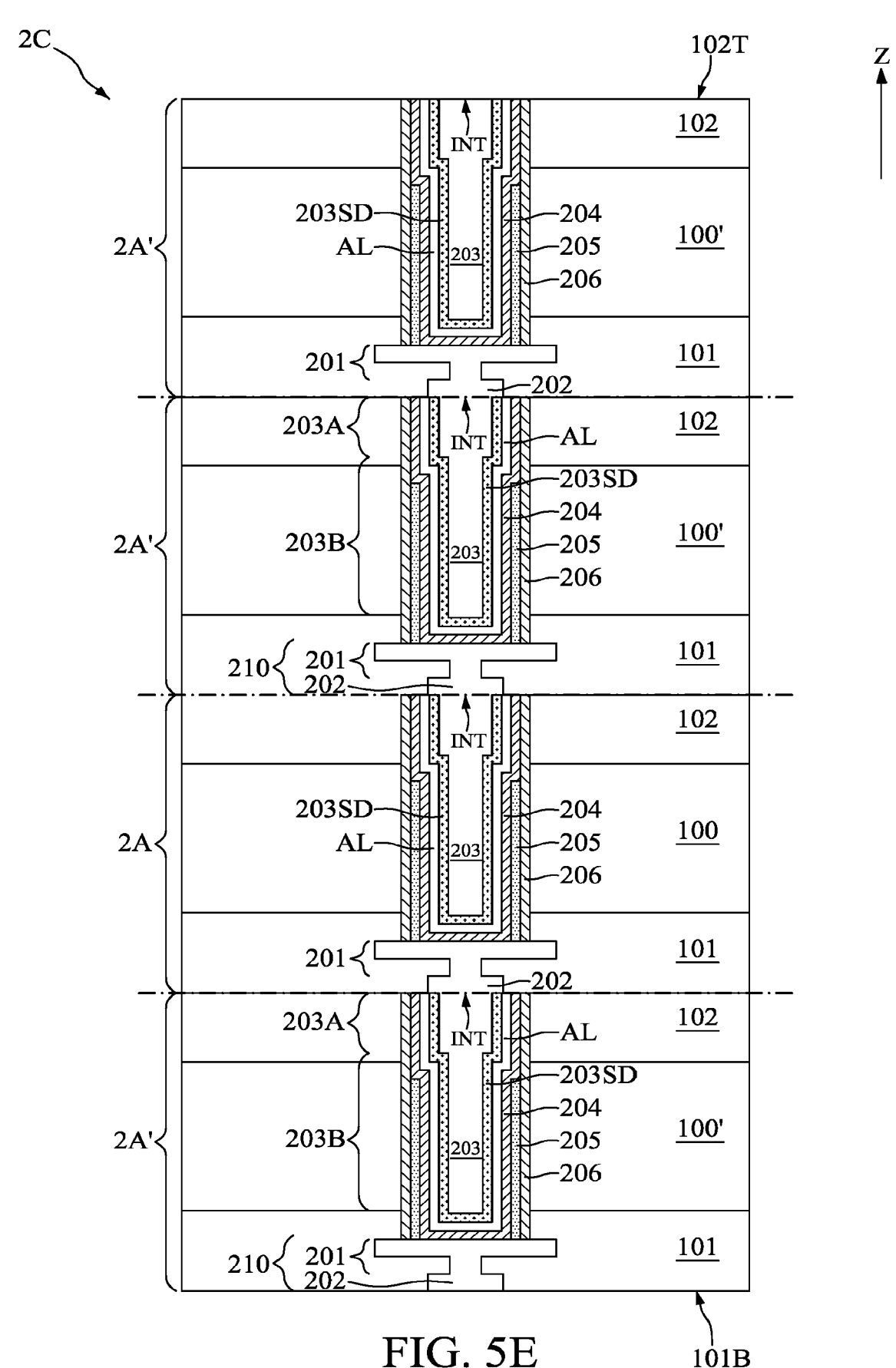
FIG. 5E is a cross-sectional view of a semiconductor device in accordance with some embodiments of the present disclosure.
Figure 6:
FIG. 6 is a cross-sectional view of a semiconductor device in accordance with some embodiments of the present disclosure.

FIGS. 5A to 5D are schematic diagrams illustrating various fabrication stages constructed according to the method S1' in accordance with some embodiments of the present disclosure. FIG. 5D, FIG. 5E, and FIG. 6 are schematic diagrams illustrating various devices that may be fabricated by performing operations of the method S1'. Further, the method S1' is similar to the method S1 depicted in FIG. 1, but with a difference in that the operation S16' in the method S1' is different from the operation S16 in the method S1, as discussed below. Particularly, in the method S1', after performing the operations S11, S12, S13, S14 and S15 (which correspond to the operations illustrated in FIGS. 2A to 2F'), the operation S16' is performed instead of the operation S16. The operations S16', S17, S18, S19 and S20, which are performed after the operation S15, are discussed in reference to FIGS. 5A to 5D.

FIG. 5A is a cross-sectional diagram of an intermediate stage in the formation of a semiconductor device in accordance with some embodiments of the present disclosure. A polymer material layer 205M is formed in a first recess R1 and over a sidewall 206SW of an isolation liner 206. The forming of the polymer material layer 205M includes performing the pulsed etching operation as discussed in reference to FIG. 2G, as well as in reference to FIG. 2G' or FIG. 2G". A material of the polymer material layer 205M may include fluorine-based polymer, which also includes carbon. A dielectric constant of the polymer material layer 205M may be less than 3.5. The polymer material layer 205M is formed over the isolation liner 206.

A shape of the polymer material layer 205M can be controlled. Accordingly, the polymer material layer 205M when initially deposited includes a lower portion 205L, and an upper portion 205H above the lower portion 205L, wherein the upper portion 205H is proximal to a top surface 102T of a second passivation layer 102. During the pulsed etching operation (i.e., either the first type or the second type of pulsed etching operation), a removal rate of the upper portion 205H is greater than a deposition rate of the upper portion 205H, and a deposition rate of the lower portion 205L is greater than a removal rate of the lower portion 205L. Further, a removal rate of polymer material at a bottom BT of the first recess R1 is greater than a deposition rate of polymer material at the bottom BT; thus, an interconnect structure 201 may remain exposed to the first recess R1 after the pulsed etching operation is performed.

Compared to the embodiment discussed in reference to FIG. 2G, the upper portion 205H in the embodiment discussed in reference to FIG. 5A instead extends to a position below a back side 100B of a first substrate 100. A result of forming the polymer material layer 205M into a polymer liner 205 is illustrated in FIG. 5B.

FIG. 5B is a cross-sectional diagram of an intermediate stage in the formation of a semiconductor device in accordance with some embodiments of the present disclosure. The polymer liner 205 formed from the polymer material layer 205M is deposited in the first recess R1. As a result, the polymer liner 205 has a top surface 205T lower than the top surface 102T of the second passivation layer 102. A portion of the isolation liner 206 may be exposed above the polymer liner 205. In some embodiments, as shown in FIG. 5B, the top surface 205T of the polymer liner 205 is below the back side 100B of the first substrate 100. In some embodiments, the polymer liner 205 has a thickness TK1 that is between about 50 nm and about 500 nm. The polymer liner 205 is in direct contact with an interconnect structure 201 of a conductive feature 210. A material of the polymer liner 205 may include fluorine-based polymer. A dielectric constant of the polymer liner 205 may be less than 3.5.

FIG. 5C is a cross-sectional diagram of an intermediate stage in the formation of a semiconductor device in accordance with some embodiments of the present disclosure. Similar to the operations depicted in FIGS. 2I to 2K, the operations S17 and S18 are performed. In the operation S17, a barrier layer 204 is formed in the first recess R1. In some embodiments, the barrier layer 204 is formed over a sidewall 205SW of the polymer liner 205, over the top surface 205T of the polymer liner 205, over the sidewall 206SW of the isolation liner 206, and over the interconnect structure 201 that is exposed at the bottom BT of the first recess R1. An adhesion layer AL is conformally formed over the barrier layer 204. After the operation S17 is performed, a seed layer 203SD can be conformally formed over the adhesion layer AL. In the operation S18, a TSV 203 is formed by depositing a conductive material in the first recess R1, then performing a planarization operation, such as a chemical mechanical planarization (CMP) operation. Accordingly, a first semiconductor chip 2A is formed.

The first semiconductor chip 2A depicted in FIG. 5C is similar to the first semiconductor chip 1A depicted in FIG. 2K, with a difference in that, in the first semiconductor chip 2A, the top surface 205T of the polymer liner 205 is below the back side 100B of the first substrate 100. The first semiconductor chip 2A can be utilized in various types of semiconductor devices, such as dynamic random-access memory (DRAM), three-dimensional integrated circuits (3DIC), memory stacks, logic stacks, memory devices, and the like. In some embodiments, in order to form the aforesaid semiconductor device, the first semiconductor chip 2A can be stacked with other semiconductor chips or semiconductor structures. Some embodiments will be respectively discussed with reference to FIG. 5D, FIG. 5E and FIG. 6.

FIG. 5D is a cross-sectional view of a semiconductor device in accordance with some embodiments of the present disclosure. In the operations S19 and S20, the first semiconductor chip 2A is coupled to a second semiconductor chip 2A' and a top connector 305 is formed over the conductive pad 202 of the first semiconductor chip 2A. In some embodiments, the first semiconductor chip 2A is bonded to the second semiconductor chip 2A' by performing a hybrid bonding operation. Next, a top passivation layer 301, a top barrier layer 303, and the top connector 305 are formed over a back side 101B of a first passivation layer 101 of the first semiconductor chip 2A, thereby obtaining the semiconductor device 1B. In some embodiments, a configuration of the second semiconductor chip 2A' can be similar to that of the first semiconductor chip 2A depicted in FIG. 5C or the first semiconductor chip 1A depicted in FIG. 2K. The second semiconductor chip 2A' includes a second substrate 100' that is similar to the first substrate 100 depicted in FIG. 2K. The first substrate 100 of the first semiconductor chip 2A is coupled to the second substrate 100' of the second semiconductor chip 2A' through a hybrid bonding operation. Details of the hybrid bonding operation are discussed above with reference to FIGS. 2L to 2M. Details of the formation of the top passivation layer 301, the top barrier layer 303, and the top connector 305 are discussed above with reference to FIG. 2N.

FIG. 5E is a cross-sectional view of a semiconductor device in accordance with some embodiments of the present disclosure. The semiconductor device 2C depicted in FIG. 5E is similar to the semiconductor device 2B depicted in FIG. 5D. A difference is that the semiconductor device 2C depicted in FIG. 5E includes more than two semiconductor chips in a stack. For example, one first semiconductor chip 2A is coupled to more than one second semiconductor chip 2A'. In such embodiments, the hybrid bonding operation can be repeated.

FIG. 6 is a cross-sectional view of a semiconductor device in accordance with some embodiments of the present disclosure. The semiconductor device 2D depicted in FIG. 6 is similar to the semiconductor device 2B depicted in FIG. 5D. A difference is that, in the semiconductor device 2D, each of the first semiconductor chip 2A and the second semiconductor chip 2A' can have two or more TSVs 203.

One aspect of the present disclosure provides a semiconductor device including a first substrate including a front side and a back side parallel to the front side; a first passivation layer positioned over the front side of the first substrate; a second passivation layer positioned over the back side of the first substrate, wherein the second passivation layer has a top surface facing away from the first substrate; a conductive feature positioned in the first passivation layer, wherein the conductive feature includes a conductive pad and an interconnect structure electrically connected to the conductive pad; a through substrate via (TSV) penetrating through the second passivation layer and the first substrate, wherein the TSV is electrically coupled to the conductive feature; and a polymer liner positioned between the TSV and the first substrate, wherein a top surface of the polymer liner is lower than the top surface of the second passivation layer; a barrier layer positioned between the second passivation layer and the TSV, between the polymer liner and the TSV, and between the interconnect structure and the TSV; and an adhesion layer positioned between the barrier layer and the TSV.

Another aspect of the present disclosure provides a semiconductor device including a first semiconductor chip including a first substrate having a front side and a back side parallel to the front side; a first passivation layer positioned over the front side of the first substrate; a second passivation layer positioned over the back side of the first substrate, wherein the second passivation layer has a top surface facing away from the first substrate; a conductive feature positioned in the first passivation layer; a through substrate via (TSV) exposed through the second passivation layer and electrically coupled to the conductive feature; a polymer liner positioned between the TSV and the first substrate; a barrier layer positioned between the second passivation layer and the TSV, between the polymer liner and the TSV, and between the conductive feature and the TSV; an adhesion layer positioned between the barrier layer and the TSV; and a second semiconductor chip coupled to the first semiconductor chip at a bonding interface and including a second substrate coupled to the first substrate. The polymer liner of the first semiconductor chip is separate from the bonding interface.

Another aspect of the present disclosure provides a method for fabricating a semiconductor device, including forming a conductive feature in a first passivation layer over a front side of a first substrate; forming a second passivation layer over a back side of the first substrate; forming a first recess in a top surface of the second passivation layer to expose the conductive feature; conformally forming an isolation liner on a sidewall of the first recess; performing a pulsed etching operation to conformally form a polymer liner on a sidewall of the isolation liner, wherein a top surface of the polymer liner is lower than the top surface of the second passivation layer; conformally forming a barrier layer over the polymer liner and the isolation liner; conformally forming an adhesion layer over the barrier layer; and forming a conductive material in the first recess to form a through substrate via (TSV).

In conclusion, the present disclosure provides a semiconductor device with a polymer liner and a method of forming the semiconductor device with the polymer liner.

In order to address issues of expansion and deformation of conductive materials at high temperature in a hybrid bonding operation, which may lead to poor yield, the present disclosure provides a semiconductor device with a polymer liner. Specifically, since the polymer liner has great flexibility, the polymer liner can reduce a deformation of a TSV or buffer a negative effect caused by deformation of the TSV. Accordingly, a degree of deformation of the TSV (especially in vertical direction) can be decreased, and a stress concentration in the TSV can be alleviated.

A shape of the polymer liner can be controlled by conditions of the pulsed etching operation discussed with reference to FIG. 2G, such as the first type of pulsed etching operation as depicted in FIG. 2G' or the second type of pulsed etching operation as depicted in FIG. 2G". As a result, the first semiconductor chip 1A with the polymer liner 205 as depicted in FIG. 2K or the first semiconductor chip 2A with the polymer liner 205 as depicted in FIG. 5C can be obtained.

The first semiconductor chip 1A and the first semiconductor chip 2A can be used in a stacked structure to form various types of devices, as shown in FIG. 2M, FIG. 2N, FIG. 2O, FIG. 3, FIG. 5D, FIG. 5E, or FIG. 6. The aforesaid semiconductor devices or semiconductor structures can be formed by bonding multiple substrates or chips together using hybrid bonding operations.

Further, in pursuit of greater device density, distances between adjacent pairs of TSVs become smaller and smaller. Accordingly, a configuration of a polymer liner can help reduce electrical interference in semiconductor devices having greater device density (for example, the semiconductor device 1D depicted in FIG. 3, or the semiconductor device 2D depicted in FIG. 6), thereby improving device performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method for fabricating a semiconductor device, comprising:
   forming a conductive feature in a first passivation layer over a front side of a first substrate;
   forming a second passivation layer over a back side of the first substrate;
   forming a first recess in a top surface of the second passivation layer to expose the conductive feature;
   conformally forming an isolation liner on a sidewall of the first recess;
   performing a pulsed etching operation to conformally form a polymer liner on a sidewall of the isolation liner, wherein a top surface of the polymer liner is lower than the top surface of the second passivation layer;
   conformally forming a barrier layer over the polymer liner and the isolation liner;
   conformally forming an adhesion layer over the barrier layer; and
   forming a conductive material in the first recess to form a through substrate via (TSV).

2. The method for fabricating the semiconductor device of claim 1, further comprising conformally forming a seed layer over the adhesion layer.

3. The method for fabricating the semiconductor device of claim 2, further comprising coupling the TSV to a semiconductor chip through a hybrid bonding operation.

4. The method for fabricating the semiconductor device of claim 3, further comprising forming a top connector over a back side of the first passivation layer and electrically connected to the conductive feature, wherein the back side of the first passivation layer faces away from the first substrate.

5. The method for fabricating the semiconductor device of claim 4, further comprising forming a top barrier layer between the top connector and the conductive feature.

6. The method for fabricating the semiconductor device of claim 5, wherein the adhesion layer comprises titanium, tantalum, titanium tungsten, or manganese nitride.

7. The method for fabricating the semiconductor device of claim 5, wherein the seed layer comprises copper or ruthenium.

8. The method for fabricating the semiconductor device of claim 5, wherein the top barrier layer comprises aluminum fluoride and zinc oxide.

* * * * *